(12) United States Patent
Inui et al.

(10) Patent No.: US 7,623,283 B2
(45) Date of Patent: Nov. 24, 2009

(54) ACTUATOR

(75) Inventors: Satoshi Inui, Kamiina-gun (JP); Masanori Ogata, Matsumoto (JP)

(73) Assignee: Olympus Corporation, Tokyo (JP)

( * ) Notice: Subject to any disclaimer, the term of this patent is extended or adjusted under 35 U.S.C. 154(b) by 361 days.

(21) Appl. No.: 11/584,447

(22) Filed: Oct. 20, 2006

(65) Prior Publication Data

US 2007/0089973 A1     Apr. 26, 2007

(30) Foreign Application Priority Data

Oct. 24, 2005    (JP) .............................. 2005-308576

(51) Int. Cl.
     *G02B 26/08*     (2006.01)
(52) U.S. Cl. ..................................... 359/223

(58) Field of Classification Search ......... 359/223–226, 359/290, 291, 871, 872
See application file for complete search history.

(56) References Cited

U.S. PATENT DOCUMENTS 6,188,504 B1 *    2/2001    Murakami et al. .......... 359/224
6,813,049 B2      11/2004    Miyajima et al.

* cited by examiner

*Primary Examiner*—Euncha P Cherry
(74) *Attorney, Agent, or Firm*—Scully, Scott, Murphy & Presser, P.C.

(57) ABSTRACT

An actuator includes a movable plate, at least one elastic member supporting the movable plate to allow the movable plate to rock, a support holding the elastic member, a wiring layer extending on the elastic member, and a protective film covering the wiring layer. The protective film is of a resin.

1 Claim, 5 Drawing Sheets

ACTUATOR

CROSS-REFERENCE TO RELATED APPLICATIONS

This application is based upon and claims the benefit of priority from prior Japanese Patent Application No. 2005-308576, filed Oct. 24, 2005, the entire contents of which are incorporated herein by reference.

BACKGROUND OF THE INVENTION

1. Field of the Invention

The present invention relates to an actuator used in an optical scanner, an angular velocity sensor, or the like.

2. Description of the Related Art

U.S. Pat. No. 6,813,049 B2 discloses an electromagnetically driven actuator. This actuator, which is fabricated by processing an SOI substrate, comprises a flat movable plate, a pair of elastic members of an active layer supporting the flat movable plate to allow it to rock, and a frame-shaped support supporting the elastic members. The movable plate has a flat coil on its upper surface near the peripheral portion and a reflection mirror on its lower surface. The support is provided with permanent magnets. The two ends of the flat coil are electrically connected to electrode pads arranged on the support through wirings extending on the elastic members.

FIG. 7 shows the sectional structure of the elastic member in the actuator. As shown in FIG. 7, an elastic member 210 comprises a silicon active layer 211, an insulating film 212 of a silicon oxide film formed on the silicon active layer 211, a wiring layer 213 of aluminum formed on the insulating film 212, and a protective film 214 of a silicon oxide film covering the wiring layer 213.

In the conventional actuator, due to the torsional motion of the elastic member 210, a stress repeatedly acts on the wiring layer 213 and the protective film 214. As a result, small voids are generated in the wiring layer 213 of a metal such as aluminum, in which atoms tend to move readily. The small voids increase the volume of the wiring layer 213, so that, in addition to the stress of the torsional motion, a stress from the wiring layer 213 also acts on the protective film 214. As far as the stresses remain within the elastic deformation region of the protective film 214 that is on the wiring layer 213 to be in contact with it, no problem occurs. If the stresses exceed the elastic deformation region of the protective film 214, cracks are generated in the protective film 214 undesirably. Accordingly, the stress acting on the wiring layer 213 from the protective film 214 contacting with the wiring layer 213 changes depending on the locations. This causes a difference in mobility of the metal atoms in the wiring layer 213 depending on the locations, and the small voids partially grow to large voids. When the voids reach the surface, cracks are generated in the wiring layer 213 as well. These cracks may change the resistance of the wiring layer 213 to adversely affect rocking of the actuator. Due to the presence of the cracks in the protective film 214, the wiring layer 213 may undesirably communicate with the outer air to decrease the reliability such as humidity resistance of the actuator.

BRIEF SUMMARY OF THE INVENTION

The present invention is directed to an actuator comprising at least a movable plate, at least one elastic member supporting the movable plate to allow the movable plate to rock, a support holding the elastic member, a wiring layer extending on the elastic member, and a protective film covering the wiring layer. According to one aspect of the present invention, the protective film is of a resin. According to another aspect of the present invention, the wiring layer is of a refractory metal.

Advantages of the invention will be set forth in the description which follows, and in part will be obvious from the description, or may be learned by practice of the invention. Advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

The embodiments of the present invention will be described hereinafter with reference to the accompanying drawings.

First Embodiment

Figure 1:
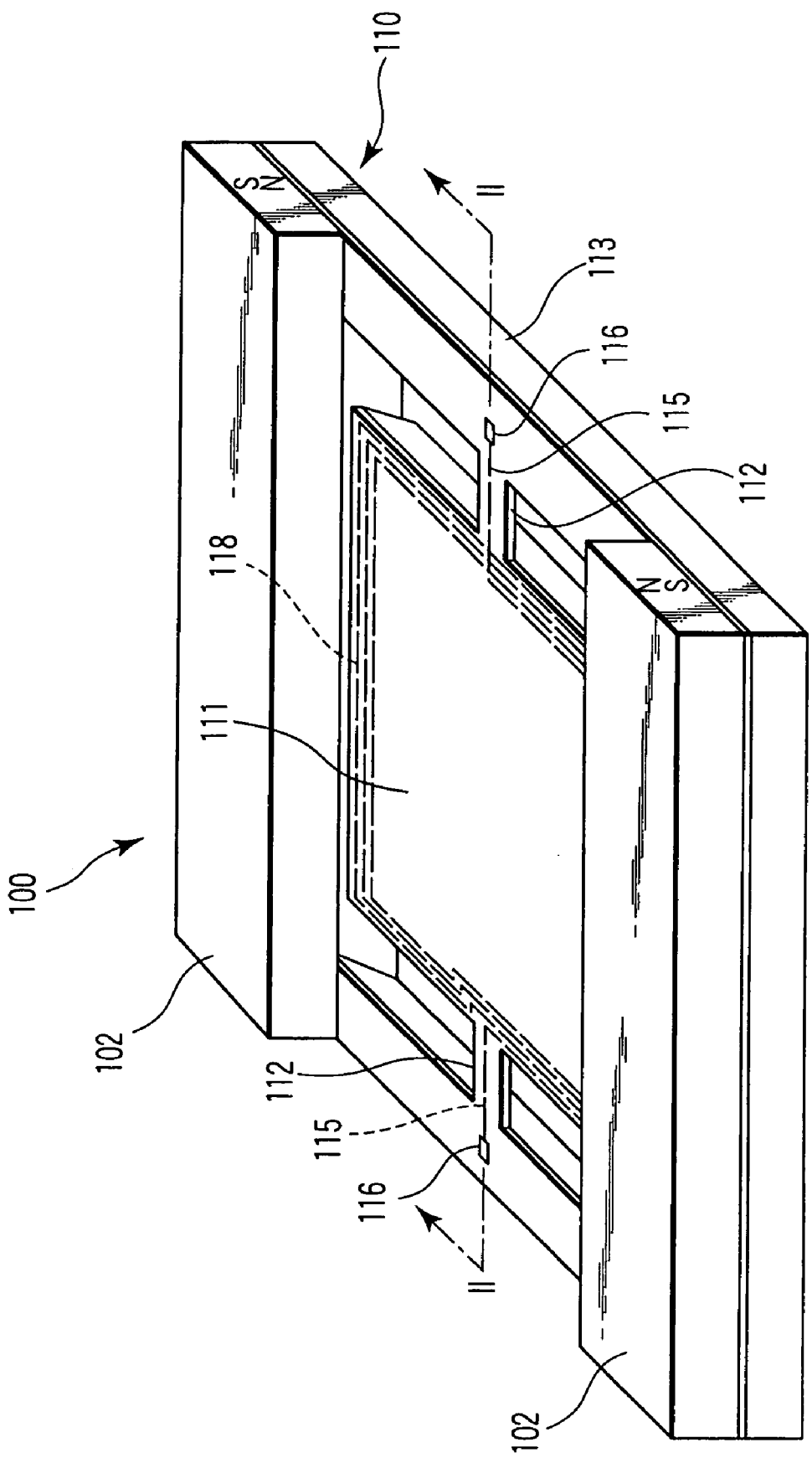
FIG. 1 is a perspective view of an actuator according to the first embodiment of the present invention.
Figure 2:
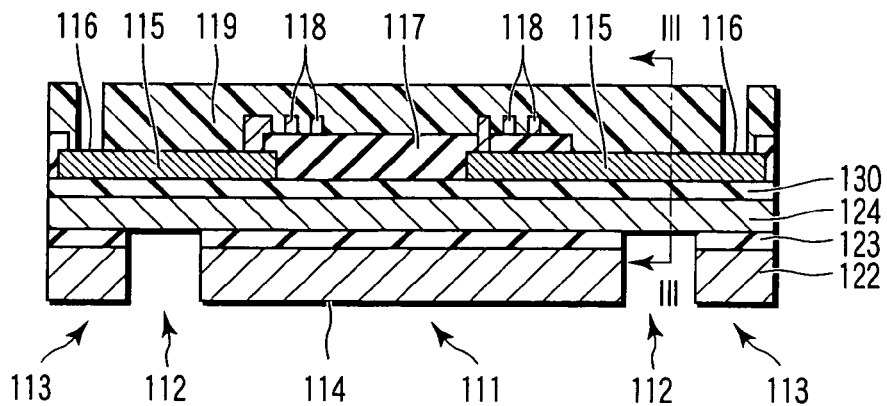
FIG. 2 shows the section of a torsional rocking body taken along the line II-II of FIG. 1.
Figure 3:
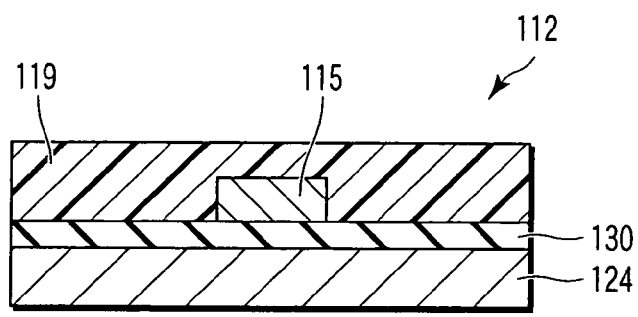
FIG. 3 shows the section of an elastic member taken along the line III-III of FIG. 2.

FIG. 1 is a perspective view of an actuator according to the first embodiment of the present invention. FIG. 2 is a sectional view of a torsional rocking body taken along the line II-II of FIG. 1. FIG. 3 is a sectional view of an elastic member taken along the line III-III of FIG. 2.

As shown in FIG. 1, an actuator 100 comprises a torsional rocking body 110 and a pair of permanent magnets 102. The torsional rocking body 110 has a movable plate 111, a pair of elastic members 112 supporting the movable plate 111 so as to allow it to rock, and a support 113 holding the elastic members 112. The pair of elastic members 112 externally extend from the two sides of the movable plate 111 symmetrically. The rocking axis of the movable plate 111 extends in the elastic members 112.

The movable plate 111 includes a flat coil 118 extending along the peripheral portion. The support 113 has a pair of electrode pads 116 for supplying external power to the flat coil 118. The torsional rocking body 110 includes wiring layers 115 extending on the elastic members 112. The wiring layers 115 respectively electrically connect the ends of the flat coil 118 to the electrode pads 116 on the support 113.

The pair of permanent magnets 102 are arranged outside the two rocking ends of the movable plate 111 to be almost parallel to the rocking axis. The permanent magnets 102 generate magnetic fields that extend across the rocking axis almost perpendicularly so that the magnetic field components in the planar direction of the movable plate 111 act on those portions of the flat coil 118 which are located at the two ends of the movable plate 111.

As shown in FIG. 2, the torsional rocking body 110 includes a protective film 119 covering the flat coil 118 and the wiring layers 115. The protective film 119 is of a resin. The movable plate 111 is provided with a reflection mirror 114, which reflects a light beam applied from outside, on the lower surface.

The operation of the actuator 100 will be described. Referring to FIG. 1, in response to an application of an AC voltage to the two electrode pads 116 on the support 113, an AC current flows through the flat coil 118. The current flowing through those portions of the flat coil 118 which are close to the permanent magnets 102 receives the Lorentz force by the interaction with the magnetic fields generated by the permanent magnets 102, so that the movable plate 111 receives a couple of forces in the direction of plate thickness. Accordingly, the movable plate 111 rocks about a center axis extending in the longitudinal directions of the two elastic members 112 as the rocking axis, that is, moves torsionally.

The actuator 100 is used as an optical scanner. A light beam is applied on the reflection mirror 114 provided to the movable plate 111 from outside. The light beam reflected by the reflection mirror 114 is scanned in accordance with the rocking of the movable plate 111.

As shown in FIG. 2, the torsional rocking body 110 is fabricated from an SOI substrate 121 comprising a substrate layer 122, a buried silicon oxide layer 123, and a silicon active layer 124. The movable plate 111, the elastic members 112, and the support 113 are formed by etching the substrate layer 122, the buried silicon oxide layer 123, and the silicon active layer 124 along the outlines of the movable plate 111, the elastic members 112, and the support 113. The elastic members 112 are formed by selectively etching the substrate layer 122 and the buried silicon oxide layer 123.

As shown in FIGS. 2 and 3, the wiring layers 115 of a metal such as aluminum are formed on a silicon oxide film 130 formed on the silicon active layer 124. As shown in FIG. 2, an insulating film 117 comprising a silicon oxide film is formed on the movable plate 111. The flat coil 118 of a metal such as aluminum is formed on the insulating film 117. The ends of the flat coil 118 respectively electrically connect to the wiring layers 115. The flat coil 118 and the wiring layers 115 are covered with a protective film 119 of a resin such as a polyimide film. As shown in FIG. 3, the wiring layers 115 are covered with the protective film 119 throughout the entire widths of the elastic members 112. So, the wiring layers 115 are protected from the atmosphere. The ends of the wiring layers 115 are exposed through openings formed in the protective film 119 and serve as the electrode pads 116.

A method of manufacturing the wiring layers 115 and the protective film 119 will be briefly described. First, aluminum is deposited on the silicon oxide film 130 on the silicon active layer 124 by, e.g., sputtering. The aluminum film is patterned into a desired shape by photolithography to form the wiring layers 115. Subsequently, a polyimide film is deposited on the elastic members 112 throughout their entire widths by printing to completely cover the wiring layers 115, forming the protective film 119.

According to this embodiment, the protective film 119 covering the wiring layers 115 is of a resin such as polyimide. The resin has a wider elastic deformation region than a silicon oxide film. Assume that the stress of the torsional motion forms small voids in the wiring layers 115 to increase the volumes of the wiring layers 115. Even if a stress generated by the torsional motion or a stress caused by the increase of the volumes of the wiring layers 115 acts on the protective film 119, cracks will not be generated readily. So, the wiring layers 115 will not communicate with the outer air, and the reliability and the service life of the actuator are increased. Namely, the protective film 119 of a flexible resin absorbs the stress generated by the torsional motion and the stress generated by the increase in volume of the wiring layers to hinder cracks from being generated readily, which inhibits the wiring layers to come into contact with the outer air to prevent a decrease in humidity resistance and the like, so that the reliability and the service life can increase.

Other than the polyimide resin, the protective film 119 may be formed of a resin such as a silicone-based resin, an epoxy resin, a fluoroplastic, or a polycarbonate resin.

To form the protective film 119, polyimide is deposited by printing. Alternatively, polyimide may be deposited by spin coating, and thereafter patterned by photolithography.

To form the wiring layers 115, aluminum is used. Other than aluminum, aluminum-silicon, an alloy of aluminum or aluminum-silicon, or a deposition material containing aluminum, aluminum-silicon, or their alloy may be employed without any limitation. For example, aluminum nitride/aluminum, aluminum nitride/aluminum-silicon, or the like may be employed.

Although aluminum is deposited by sputtering, it may be deposited by vapor deposition.

Figure 4:
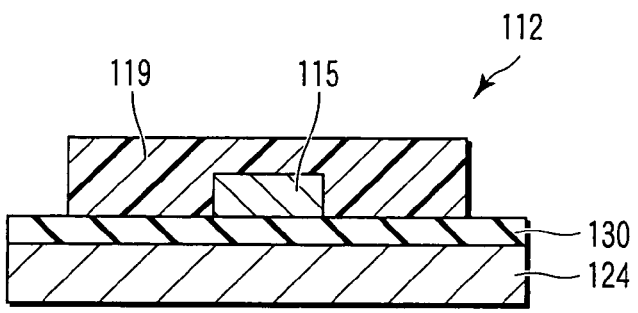
FIG. 4 shows the section of a modification of the elastic member of FIG. 3.
Figure 5:
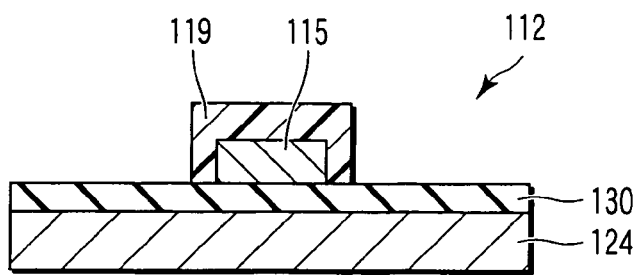
FIG. 5 shows the section of another modification of the elastic member of FIG. 3.
Figure 6A:
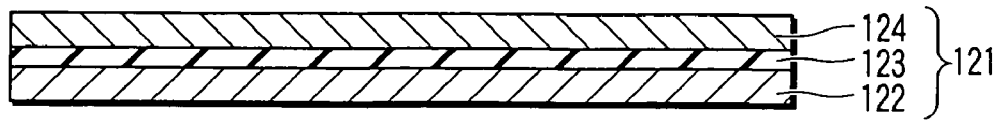
FIGS. 6A to 6H schematically show the initial steps of the manufacture of a torsional rocking body according to the second embodiment of the present invention.
Figure 6B:
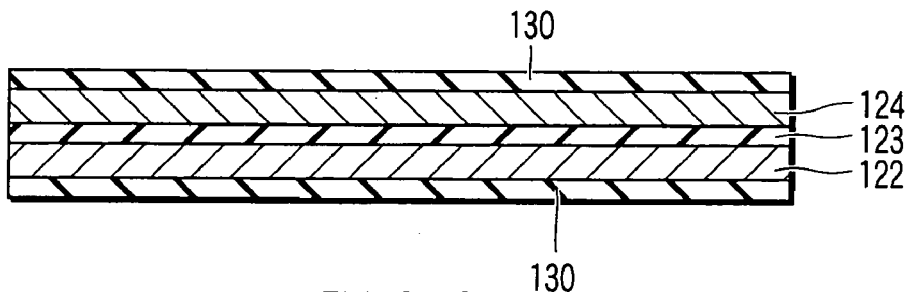
Figure 6C:
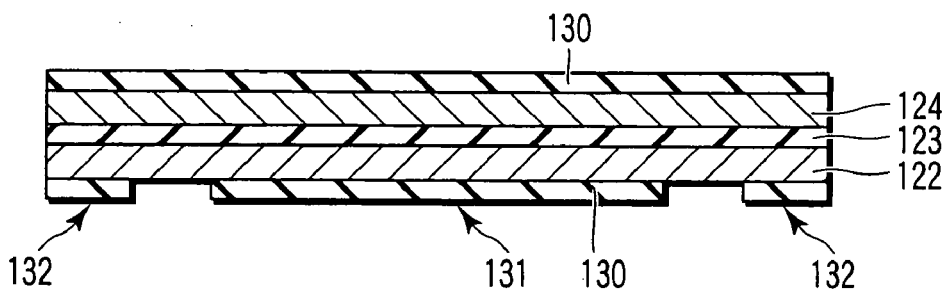
Figure 6D:
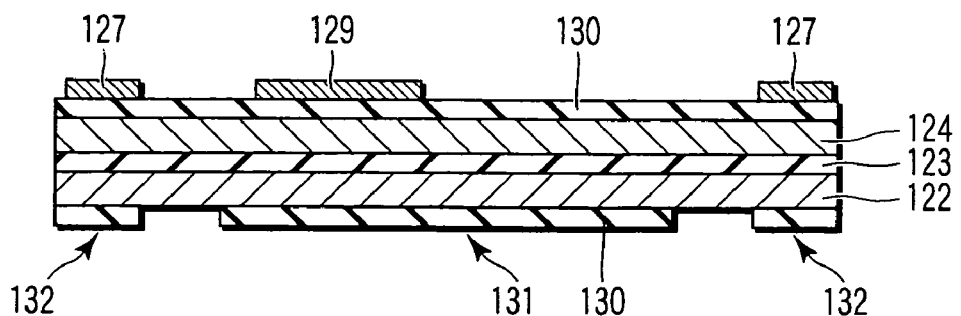
Figure 6E:
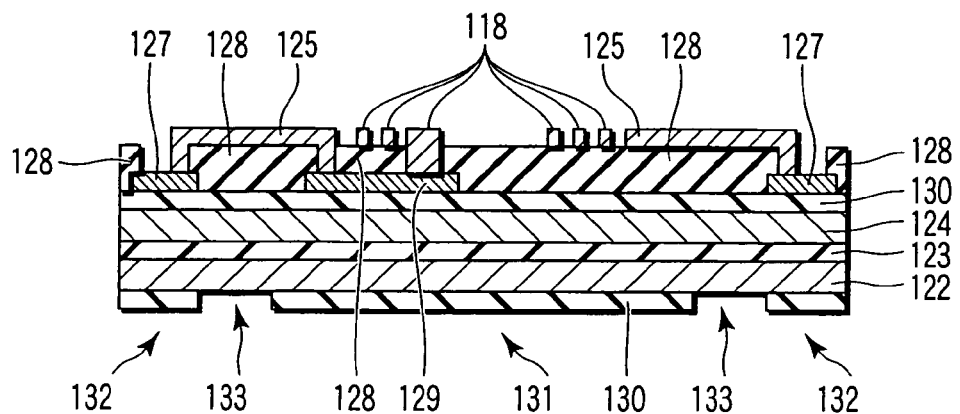
Figure 6F:
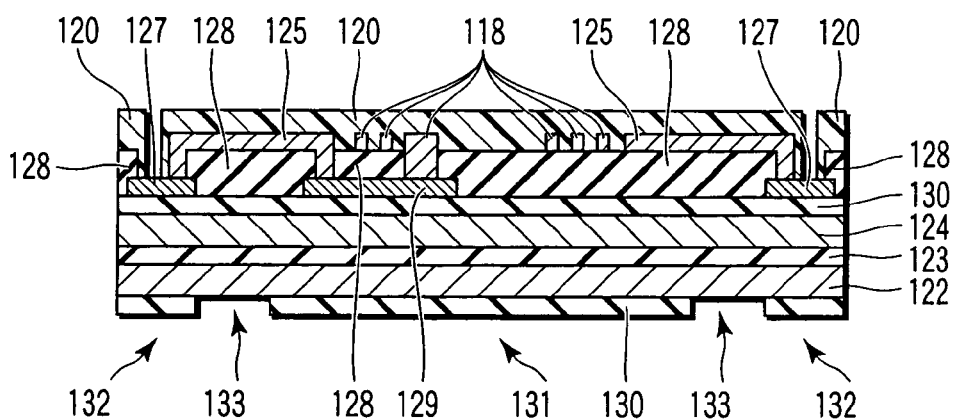
Figure 6G:
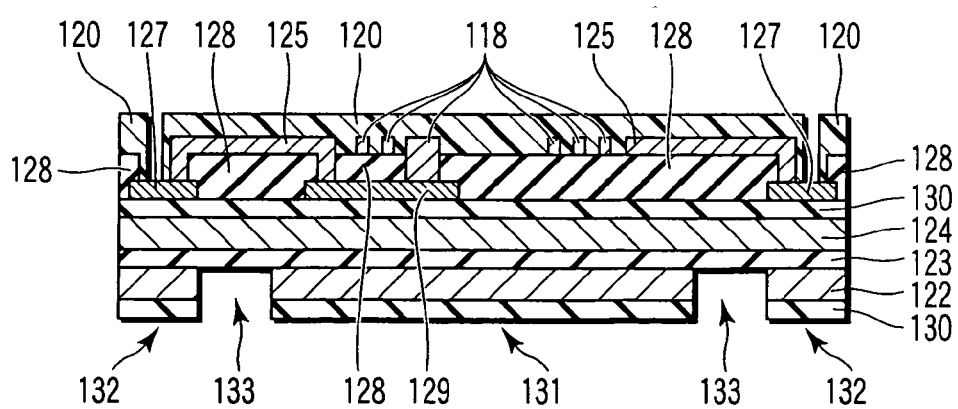
Figure 6H:
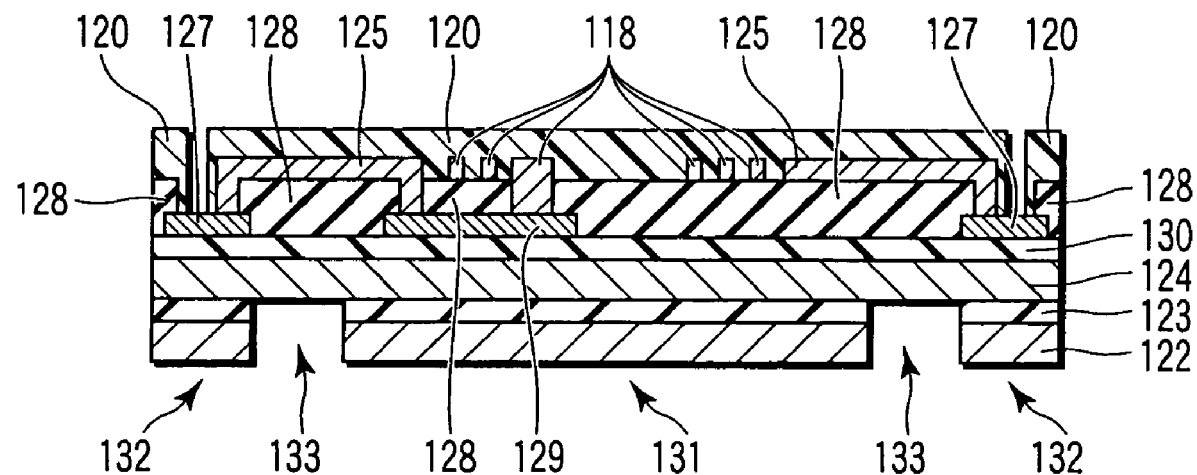
Figure 7:
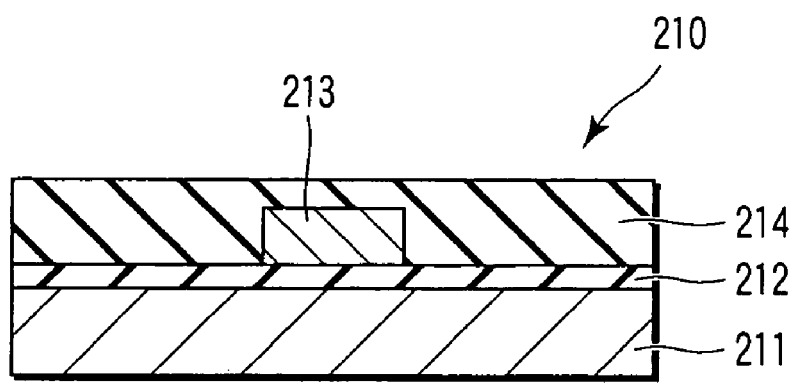
FIG. 7 shows a section of an elastic member in a conventional actuator.

The structure of the wiring layers 115 and the protective film 119 is not limited to that shown in FIG. 3, but may be modified in various manners. FIGS. 4 and 5 show modifications.

In the structure shown in FIG. 4, the protective film 119 is formed so as to cover the elastic member 112 not throughout its entire width but part of its width. In the structure shown in FIG. 5, the protective film 119 is formed so as to cover only the wiring layer 115 as much as possible.

In these modifications, as described above, even if a stress generated by torsional motion acts on the protective film or a stress generated by an increase in volume caused by small voids generated in the wiring layer 115 acts on the protective film 119, cracks are not generated in the protective film 119 readily. So, a decrease in humidity resistance or the like is prevented, so that the reliability and the service life can increase. Namely, the protective film 119 need not cover the elastic member 112 entirely but suffices as long as it covers at least only the wiring layer 115.

Second Embodiment

The second embodiment will be described. The second embodiment is intended to improve the reliability of the wiring layers themselves in addition to the effect of the first embodiment. For this purpose, a protective film is formed of polyimide, and wiring layers are formed of copper, which can be made by electrolytic plating.

FIGS. 6A to 6H schematically show the manufacturing steps of a torsional rocking body according to this embodiment.

Step 1 (FIG. 6A): An SOI substrate 121, which has a substrate layer 122, a buried silicon oxide layer 123, and a silicon active layer 124, is prepared. The surface of the substrate layer 122 and the surface of the silicon active layer 124 are both polished to be mirror finished.

Step 2 (FIG. 6B): Silicon oxide films 130 are deposited on the surface of the substrate layer 122 and the surface of the silicon active layer 124, respectively.

Step 3 (FIG. 6C): One of the silicon oxide films 130 is selectively removed by etching except for portions that form a movable plate 131 and support portions 132.

Step 4 (FIG. 6D): An aluminum film is deposited on the silicon oxide film 130 on the silicon active layer 124 by, e.g., sputtering. After that, the aluminum film is patterned by photolithography to form driving electrodes 127 and a pad electrode 129.

Step 5 (FIG. 6E): A silicon oxide film is deposited on the silicon oxide film 130 on the silicon active layer 124 by, e.g., plasma CVD (Chemical Vapor Deposition) or sputtering. After that, this silicon oxide film is patterned by photolithography to form an insulating film 128. Subsequently, copper portions as a prospective flat coil 118 and prospective wiring layers 125 are formed simultaneously by, e.g., electrolytic plating.

Step 6 (FIG. 6F): A polyimide film as a prospective protective film 120 is deposited on the upper surface on the silicon active layer 124 side with patterned by, e.g., printing. Alternatively, the polyimide film may be deposited by spin coating and then patterned by photolithography.

Step 7 (FIG. 6G): To form elastic members 133, the substrate layer 122 is etched from the lower surface by RIE (Reactive Ion Etching). It is desirable to employ RIE that has a sufficient etching selectivity between silicon oxide and silicon. This allows etching by using the silicon oxide film 130 as a mask without patterning the resist. In addition, in the final stage of etching of the substrate layer 122, when overetching is performed in order to completely remove the substrate layer 122, the buried silicon oxide layer 123 prevents the silicon active layer 124 that should not be etched from being etched. The substrate layer 122 may be etched by anisotropic etching of silicon crystal using an alkali etching liquid, e.g., aqueous solution of tetramethyl ammonium hydroxide. This etching separates the substrate layer portions of the movable plate 131 and the support portions 132.

Subsequently, to form the movable plate 131, the elastic members 133, and the support portions 132, using the insulating film 128 and the driving electrodes 127 as the mask, the silicon active layer 124 is etched to be removed by, e.g., an RIE device. Namely, the active layer is etched to leave the movable plate 131, the elastic members 133, and the support portions 132.

Step 8 (FIG. 6H): The silicon oxide film 130 on the lower surface of the substrate layer and the buried silicon oxide layer 123 are simultaneously etched to be removed by RIE. This forms the movable plate 131, the elastic members 133, and the support portions 132, fabricating a structure in which the movable plate 131 is supported by the support portions 132 through the elastic members 133.

A reflecting portion for reflecting light is formed on the movable plate 131 by polishing, e.g., the substrate layer (silicon layer) 122 of the SOI substrate 121. This manner is suitable for saving the machining time and the material to form the reflecting portion.

Finally, the SOI substrate is diced to produce chips, and permanent magnets are mounted on the outer sides of the two vibrating ends of the movable plate 131, e.g. with an adhesive, in substantially parallel to the rocking axis, completing an actuator.

According to this embodiment, the wiring layers 125 are of copper. Since copper has a higher electrical conductivity than that of aluminum, wiring widths are allowed to be narrowed. Electrolytic plating allows thick copper layer wirings to be formed, leading to narrower wiring widths.

According to a stress simulation using the finite element method, the stress is smaller at the center of the elastic member than at the edges of the elastic member. So, the wiring width is decreased, so a thick, narrow-width wiring layer may be formed at the center of the elastic member where the stress value is small avoiding the edges of the elastic member where the stress value is high.

Hence, the influence of the stress from the elastic member is small, so that the movement of atoms hardly occurs in the wiring layers, preventing an additional stress from being generated by voids in the wiring layers or an increase in volume of the wiring layers. Thus, cracks do not form in the protective film, and the wiring layers do not communicate with the outer air. This increases the reliability and the service life of the actuator. More specifically, the wiring layers themselves prevent a decrease in reliability. The resin protective film on the wiring layers further increase the reliability and the service life.

According to this embodiment, the wirings on the elastic members and the flat coil are formed simultaneously from one copper layer by electrolytic plating. This simplifies the manufacturing process of the actuator to reduce the cost and increase the yield, thus providing a high-reliability actuator.

Although copper is raised as the material of the wiring layers, other than copper, a refractory metal such as titanium, molybdenum, or tungsten may be employed. As the refractory metal, one having a melting point that satisfies the following equation (1) is preferable:

$$T_M \geq T/0.3 \qquad (1)$$

where T is the temperature used [K], and $T_M$ is the melting point [K].

This is because of the generally known fact that in a refractory metal that satisfies equation (1), the movement of atoms, that is, the creep phenomenon, due to the stress does not occur.

When the wiring layers are of a refractory metal, the movement of atoms caused by the stress is suppressed.

When wiring layers of a refractory metal are employed, the wiring layers themselves have an effect of preventing a decrease in reliability such as humidity resistance, providing high reliability and a long service life. So, as the protective film, a silicon oxide film may be employed in the same manner as in the conventional actuator.

According to this embodiment, the wiring layers and the flat coil are formed simultaneously by electrolytic plating, but may be formed by sputtering or vapor deposition. Although the wring layers and the flat coil are formed simultaneously, they may be formed separately.

Other than the polyimide resin, the protective film may be formed of a resin such as a silicone-based resin, an epoxy resin, a fluoroplastic, or a polycarbonate resin.

Several embodiments have been described in detail with reference to the accompanying drawings. The present invention is not limited to the embodiments described above, but incorporates all embodiments that can be practiced without departing from the spirit and scope of the invention.

For example, the embodiments described above exemplify an electromagnetically driven actuator driven by generating a force with the interaction of the magnetic fields and the current. The principle of generating the driving force is not limited to this. The present invention also incorporates actuators that obtain a driving force by other principles, e.g., the Coulomb force.

The embodiments described above exemplify an actuator in which the two elastic members support the movable plate. However, the present invention is not limited to this. For example, the present invention incorporates a cantilevered actuator in which one elastic member supports the movable plate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. An actuator comprising:

a movable plate;

at least one elastic member supporting the movable plate to allow the movable plate to rock;

a support holding the elastic member;

a wiring layer extending on the elastic member and made of a refractory metal that satisfies $T_M \geq T/0.3$;

where T is a temperature used [K], and $T_M$ is a melting point[K]; and a protective film covering the wiring layer.

* * * * *